United States Patent
Wong et al.

(10) Patent No.: US 8,016,183 B2
(45) Date of Patent: Sep. 13, 2011

(54) ADJUSTABLE CLAMP SYSTEM AND METHOD FOR WIRE BONDING DIE ASSEMBLY

(75) Inventors: Wai Keong Wong, Shah Alam (MY); Sik Pong Lee, Petaling Jaya (MY)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 12/612,687

(22) Filed: Nov. 5, 2009

(65) Prior Publication Data

US 2011/0101072 A1    May 5, 2011

(51) Int. Cl.
*B23K 31/00*    (2006.01)
*B23K 11/16*    (2006.01)

(52) U.S. Cl. ...... 228/180.5; 228/4.5; 228/904; 219/56.1

(58) Field of Classification Search .............. 228/4.5, 228/180.5, 904; 219/56.1
See application file for complete search history.

(56) References Cited

U.S. PATENT DOCUMENTS

| | | | |
|---|---|---|---|
| 5,116,031 A * | 5/1992 | Takeuchi et al. ............. 269/87.3 |
| 5,281,794 A | 1/1994 | Uehara et al. | |
| 5,307,977 A | 5/1994 | Park | |
| 5,372,972 A * | 12/1994 | Hayashi et al. ................. 29/827 |
| 5,558,267 A | 9/1996 | Humphrey et al. | |
| 6,118,175 A * | 9/2000 | Anderson et al. ............. 257/676 |
| 6,423,102 B1 * | 7/2002 | Fukunaga et al. ........... 29/25.01 |
| 6,637,636 B2 * | 10/2003 | Ball ............................... 228/4.5 |
| 6,715,659 B2 * | 4/2004 | Ball ............................... 228/4.5 |
| 2007/0065144 A1 * | 3/2007 | Hofmeister et al. .......... 396/611 |

* cited by examiner

*Primary Examiner* — Jessica L Ward
*Assistant Examiner* — Devang R Patel
(74) *Attorney, Agent, or Firm* — Charles Bergere

(57) ABSTRACT

A method and an adjustable clamp system for clamping a die assembly during wire bonding. The system includes at least one pair of opposing base walls, each of the base walls has a base clamping surface. There is at least one pair of clamping members, each one of the clamping members being movable towards a respective base clamping surface to thereby clamp a lead frame of the die assembly. A die assembly support is disposed between the pair of opposing base walls and the die assembly support and pair of opposing base walls provide a cavity. There is a position sensor coupled to a controller and there is also a drive that is controllable by the controller. The drive provides movement of the die assembly support relative to each the base clamping surface to thereby adjust a depth of the cavity. In operation, after the lead frame is clamped between the base clamping surface and clamping members, the controller allows the drive to provide the relative movement until the position sensor detects that an underside of the lead frame has abutted the die assembly support.

7 Claims, 8 Drawing Sheets

ADJUSTABLE CLAMP SYSTEM AND METHOD FOR WIRE BONDING DIE ASSEMBLY

BACKGROUND OF THE INVENTION

The present invention relates to an adjustable clamp system and method. More specifically, the present invention relates to an adjustable clamp system and method used for wire bonding electrodes of a semiconductor die to pads of a lead frame.

Typical packaged semiconductors are formed with a semiconductor die mounted to a lead frame. The lead frame is formed from a sheet of metal that comprises a flag and arms attach the flag to a frame. Each of the arms are bent so that the frame and flag are in different planes, this is often referred to as the flag being "down-set".

Pads on leads of the lead frame are wire bonded to electrodes of the die to thereby provide a means of easily electrically connecting the die to circuit boards and the like. After the electrodes and pads are wire bonded, the semiconductor die and pads are encapsulated (packaged) in a compound such as a plastics material leaving only sections of the leads exposed. These exposed leads are cut from the frame of the lead frame (singulated) and bent for ease of connection to a circuit board.

During the wire bonding the lead frame is clamped in a clamp system that has a clamp support for supporting the flag, however, due to manufacturing tolerances the distance of the "down-set" can vary thereby causing either skewing of the lead frame in the clamp system or suspending the flag from the clamp support. Both the skewing of the lead frame and suspending of the flag may cause wire bonding defects due to bouncing of the die, bouncing of the pads or under-heating of the pads during wire bonding.

BRIEF DESCRIPTION OF THE DRAWINGS

The invention, together with objects and advantages thereof, may best be understood by reference to the following description of preferred embodiments together with the accompanying drawings in which.

DETAILED DESCRIPTION OF PREFERRED EMBODIMENTS

Figure 1:
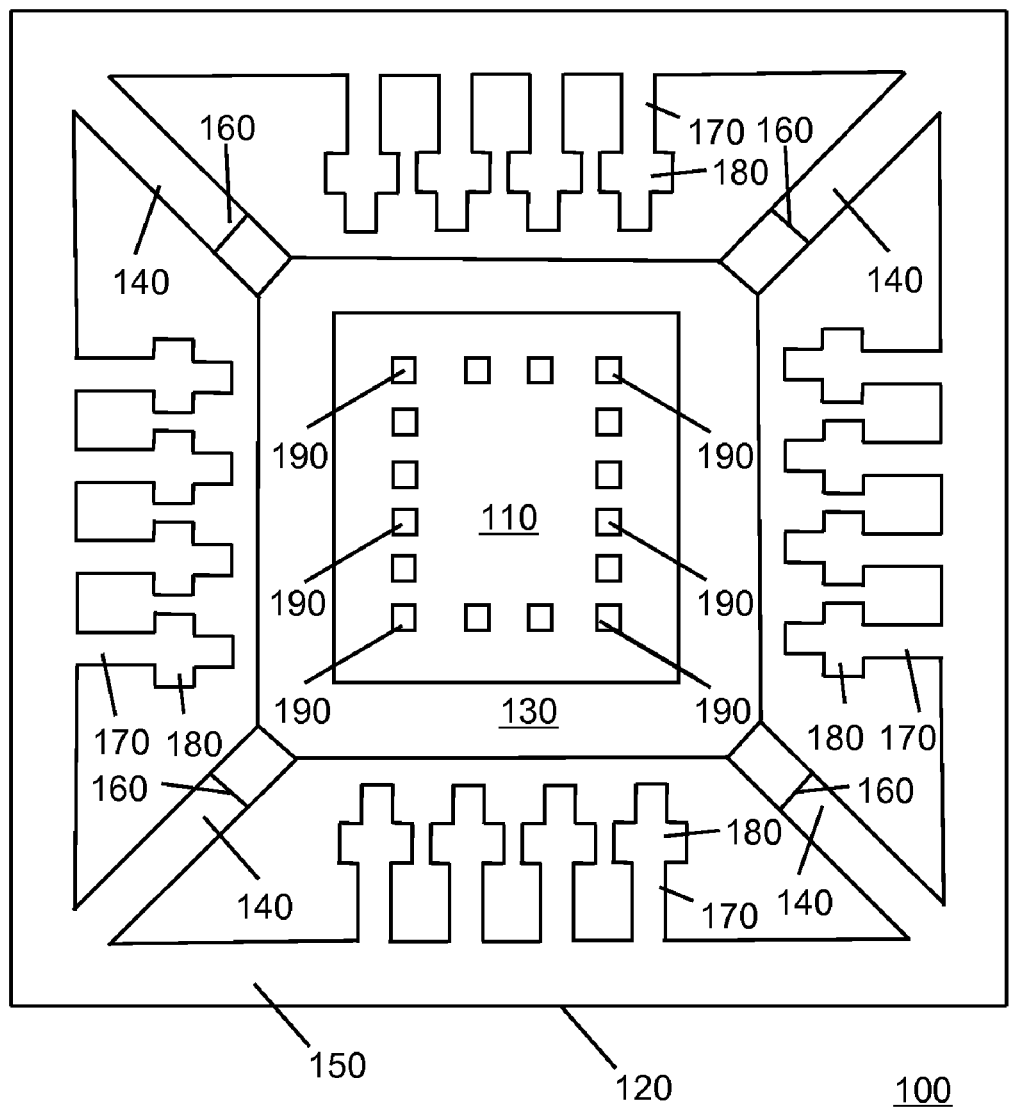
FIG. 1 is a plan view of a typical prior art die assembly.

The detailed description set forth below in connection with the appended drawings is intended as a description of presently preferred embodiments of the invention, and is not intended to represent the only forms in which the present invention may be practiced. It is to be understood that the same or equivalent functions may be accomplished by different embodiments that are intended to be encompassed within the spirit and scope of the invention. In the drawings, like numerals are used to indicate like elements throughout. Furthermore, terms "comprises," "comprising," or any other variation thereof, are intended to cover a non-exclusive inclusion, such that system, circuit, device components and method steps that comprises a list of elements or steps does not include only those elements but may include other elements or steps not expressly listed or inherent to such system, circuit, device components or steps. An element or step proceeded by "comprises . . . a" does not, without more constraints, preclude the existence of additional identical elements or steps that comprises the element or step.

In one embodiment, the present invention provides an adjustable clamp system for clamping a die assembly during wire bonding. The system includes at least one pair of opposing base walls and each of the base walls has a base clamping surface. There is at least one pair of clamping members, each one of the clamping members being movable towards a respective base clamping surface to thereby clamp a lead frame of the die assembly therebetween. A die assembly support is disposed between the pair of opposing base walls, wherein the die assembly support and pair of opposing base walls provide a cavity. There is a position sensor coupled to a controller and there is also a drive that is controllable by the controller. The drive provides movement of the die assembly support relative to each the base clamping surface to thereby adjust a depth of the cavity. In operation, after the lead frame is clamped between the base clamping surface and clamping members, the controller allows the drive to provide the relative movement until the position sensor detects that an underside of the lead frame has abutted the die assembly support.

In another embodiment, the present invention provides a method for clamping a die assembly during wire bonding, the die assembly having a lead frame with a die mount region with a die attached thereto. The method includes placing the die assembly in an adjustable clamp system. The system has opposing base walls and die assembly support disposed between the pair of opposing base walls. The die assembly support and pair of opposing base walls provide a cavity over which the die mount region is suspended by leads of the lead frame. The method also includes clamping the leads of the lead frame between clamping members and a base clamping surfaces provided by the opposing base walls. Next, the method performs providing relative movement of the of the die assembly support relative to the base clamping surfaces to thereby adjust a depth of the cavity. The method then performs a step of detecting that an underside of the lead frame has abutted the die assembly support and then stopping the relative movement in response to the detecting.

Referring to FIG. 1 there is illustrated a plan view of a typical prior art die assembly 100. The die assembly 100 has a semiconductor die 110 mounted to a lead frame 120. The lead frame 120 is formed from a sheet of metal (typically copper) that comprises a die mount region 130, often referred to as a flag, and arms 140 attach the die support 130 to a frame 150. Each of the arms 140 are bent by a respective crease 160 thereby bending each of the arms 140 so that the frame 150 and die mount region 130 are in different planes. Extending from the frame 150 are leads 170 that are each shaped to include a pad 180 for use in wire bonding the leads 170 to respective electrodes 190 of the die 110. The die 110 is mounted to the lead frame 120 at the die mount region 130 by a curable resin as will be apparent to a person skilled in the art.

Figure 2:
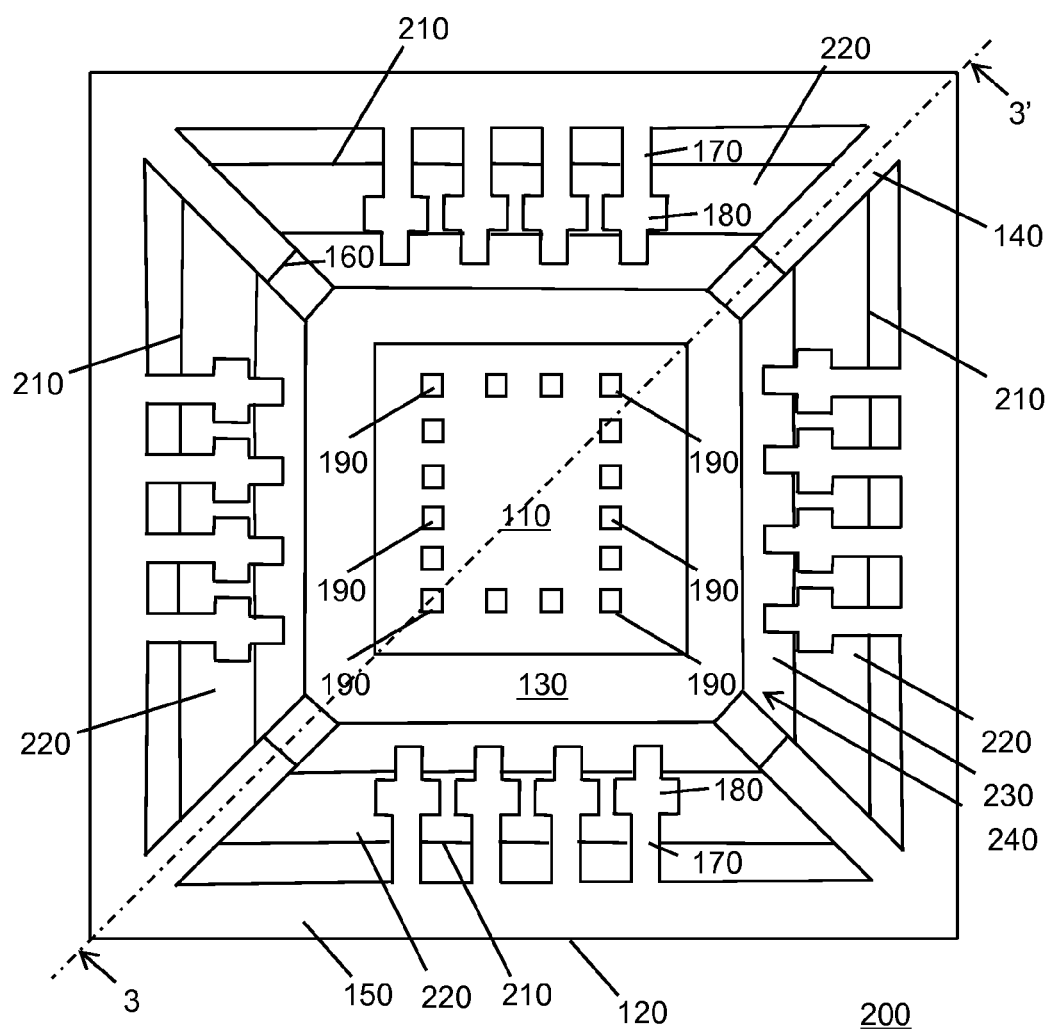
FIG. 2 is a plan view of part of a typical prior art clamp 200 to which is mounted the die assembly of FIG. 1.

Referring to FIG. 2 there is illustrated a plan view of part of a typical prior art clamp 200 to which is mounted the die assembly 100. The clamp 200 is used during wire bonding of the leads 170 to respective electrodes 190 of the die 110. As illustrated, the clamp 200 includes pairs of opposing base walls 210 and each of the base walls 210 has a base clamping surface 220 that forms a continuous track. The clamp 200 also includes a die assembly support 230 disposed between the opposing base walls 210 and the die assembly support 230 and opposing base walls 210 provide a cavity 240. It can be seen that a section of the arms 140 and a section of the leads 170 and all of the pads 180 are aligned over the base clamping surface 220. Also, the die mount region 130 and die 110 are aligned over the cavity 240.

Figure 3:
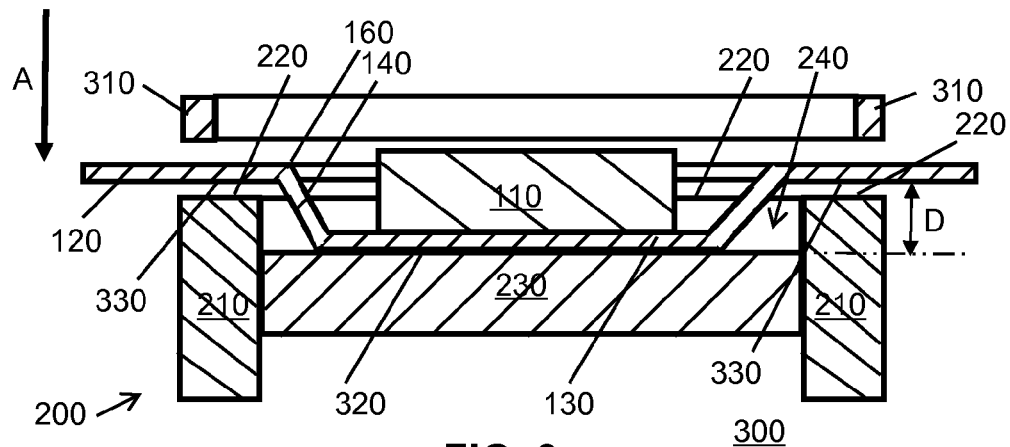
FIG. 3 illustrates part of a conventional clamp system that includes the clamp and die assembly of FIG. 2 in cross-section through 3-3' before clamping of the die assembly.

Referring to FIG. 3 there is illustrated part of a prior art clamp system 300 and die assembly 100 in cross sectional view through 3-3' before clamping of the die assembly. The clamp system 300 includes the clamp 200 and clamping members 310. The clamping members 310 form a continuous track and are aligned and moveable, in the direction of arrow A, towards the base clamping surface 220. In operation, the lead frame 120 of the die assembly 100 is clamped between the base clamping surface 220 and clamping members 310. Ideally, before clamping the die assembly 100, a mount underside 320 of the die mount region 130 should abut the die assembly support 230 whilst arm undersides 330 of the arms 140 and undersides of the pads 180 (not visible in this illustration) abut the base clamping surface 220. Once clamped, the pads 180 are heated from a heater associated with the opposing base walls and then the pads 180 are wire bonded to respective electrodes 190 of the die 110. However, due to manufacturing tolerances when forming the creases 160, the "down-set" distance D between an underside of the arms 140 and an underside of the die mount region 330 may vary. As illustrated, due to manufacturing tolerances, the "down-set" distance D is larger than the depth of the cavity 240 causing the mount underside 320, of the die mount region 330, to abut the die assembly support 230 whilst the arm undersides 330 of the arms 140 and undersides of the pads 180 are spaced from the base clamping surface 220.

Figure 4:
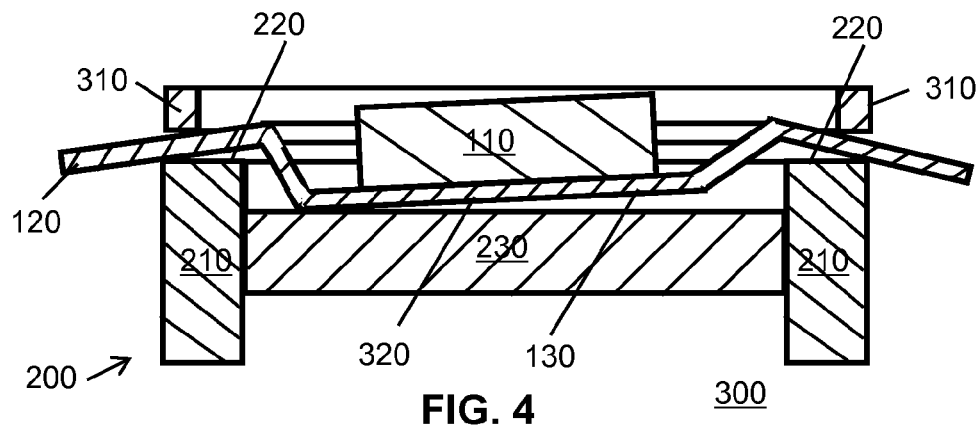
FIG. 4 illustrates another cross-sectional view of the conventional clamp system and die assembly of FIG. 3 during clamping of the die assembly.

Referring to FIG. 4 there is illustrated another cross sectional view of the prior art clamp system 300 and die assembly 100 during clamping of the die assembly 100 between the base clamping surface 220 and clamping members 310. Since the arm undersides 330 of the arms 140 and undersides of the pads 180 are spaced from the base clamping surface 220 during the clamping, the lead frame can become skewed 120 as illustrated. This skewing of the lead frame 120 results in some of the undersides of the pads 180 not fully contacting the clamping surface 220 and not all of the mount underside 320 is contacting the base clamping surface 220. Consequently, not all of the pads 180 will be sufficiently heated before wire bonding these pads 180 may bounce during wire bonding thereby possibly causing wire bonding defects. Furthermore, since not all of the mount underside 320 is contacting the base clamping surface 220, the die may bounce during wire bonding of the electrodes 190 thereby also possibly causing wire bonding defects.

Figure 5:
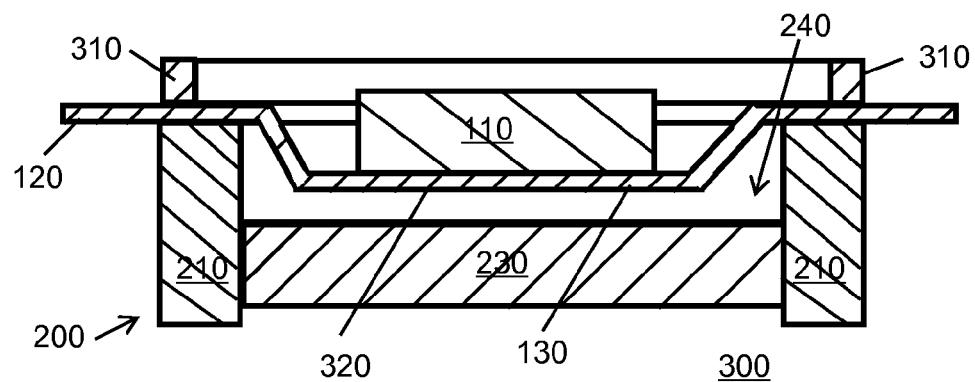
FIG. 5 illustrates a further cross-sectional view of the conventional clamp system and die assembly of FIG. 3 during clamping of the die assembly.

Referring to FIG. 5 there is illustrated a further cross sectional view of the prior art clamp system 300 and die assembly 100 during clamping of the die assembly 100 between the base clamping surface 220 and clamping members 310. As illustrated, due to manufacturing tolerances, the "down-set" distance D is smaller than the depth of the cavity 240 causing the mount underside 320, of the die mount region 330, to be spaced from the die assembly support 230 whilst the arm undersides 330 of the arms 140 and undersides of the pads 180 abut the base clamping surface 220. Consequently, when the die assembly 100 is between the base clamping surface 220 and clamping members 310 the die 100 and die mount region 130 are suspended in the cavity 240. As a result, during wire bonding of the electrodes 190 the die 110 may bounce thereby possibly causing wire bonding defects.

Figure 6:
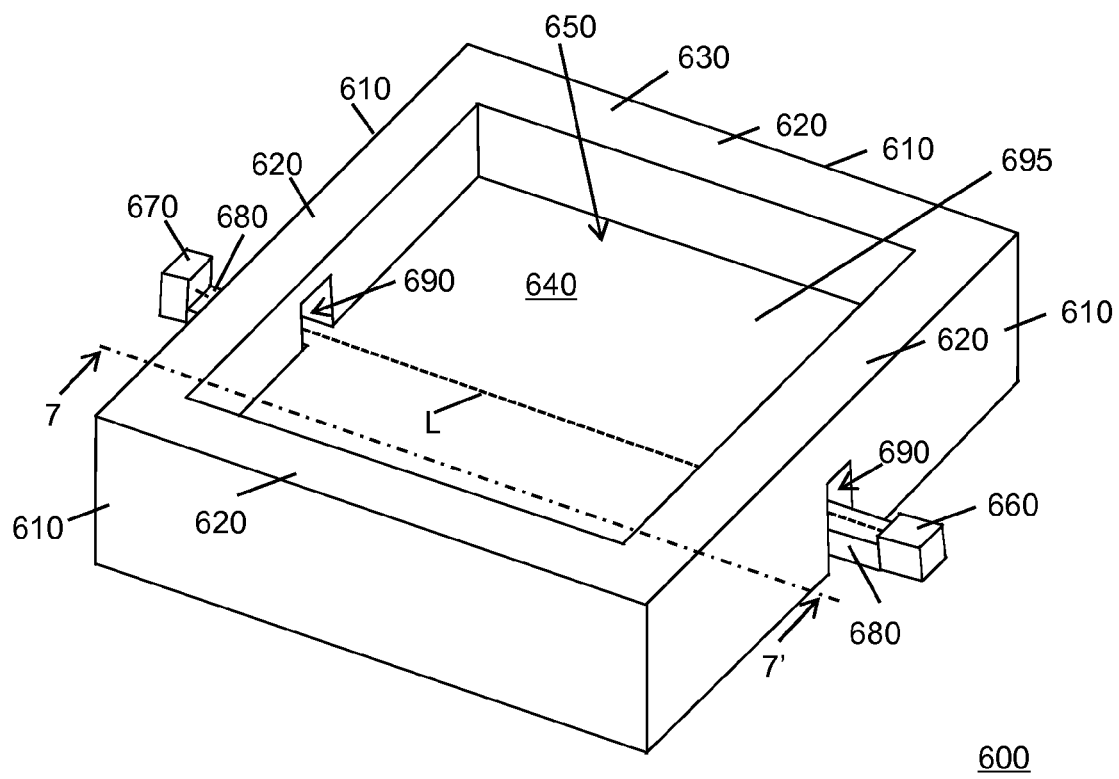
FIG. 6 illustrates a perspective view of part of an adjustable clamp for clamping a die assembly during wire bonding in accordance with an embodiment of the present invention.

Referring to FIG. 6 there is illustrated a perspective view of part of an adjustable clamp 600 for clamping a die assembly during wire bonding in accordance with an embodiment of the present invention. The adjustable clamp 600 has two pairs of opposing base walls 610, each of the base walls 610 has a base clamping surface 620 and each base clamping surface 620 forms a section of a continuous track 630. There is a die assembly support 640 disposed between the opposing base walls 610 and the die assembly support 640 and opposing base walls provide a cavity 650. Also, the continuous track 630 surrounds the die assembly support 640.

The adjustable clamp 600 also includes a Position Sensor PS in the form of a laser beam emitter 660 aligned with a beam detector 670. The laser beam emitter 660 and the laser beam detector 670 are mounted to die the assembly support by mounts 680. The laser beam emitter 660 provides a laser beam (illustrated by dotted line L) and the laser beam emitter 660 the laser beam detector 670 and communicate via the laser beam L through aligned slots 690 in the opposing base walls 610. More specifically, the laser beam emitter 660 provides the laser beam L along a plane of an upper surface 695 of the die assembly support 640.

Figure 7:
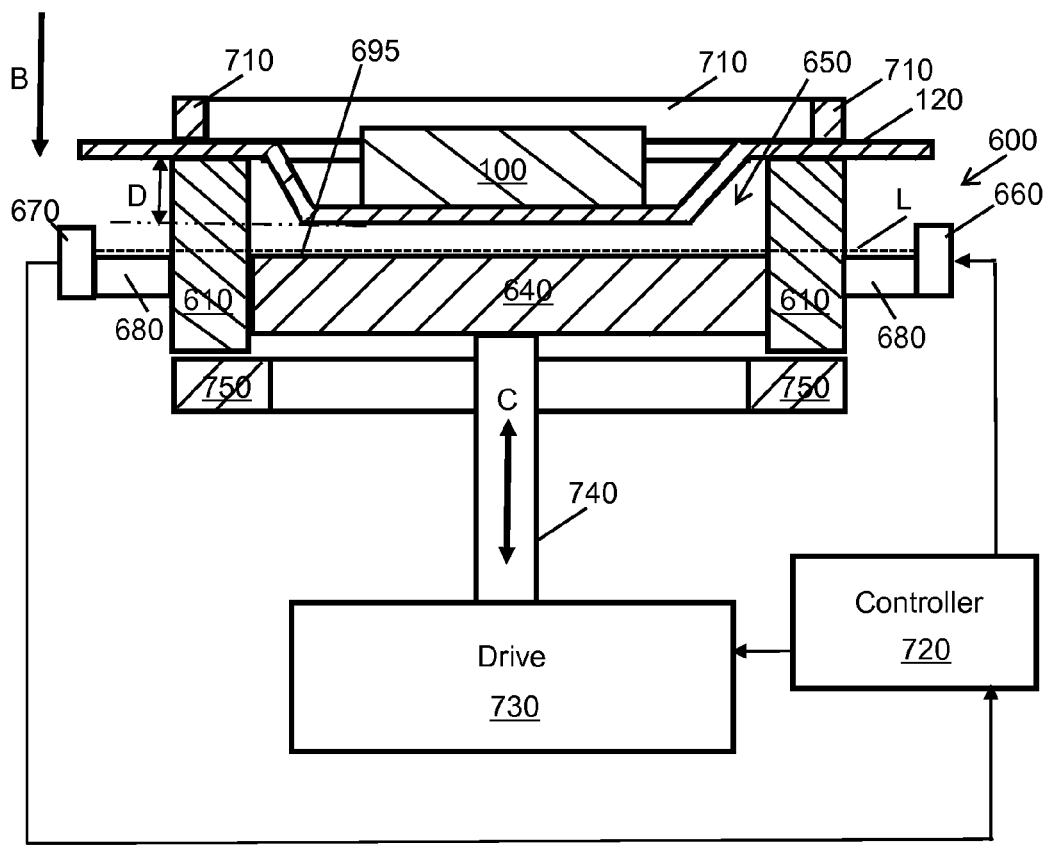
FIG. 7 illustrates a cross-sectional view through 7-7' of the adjustable clamp of FIG. 6 in a first position when incorporated into an adjustable clamp system in accordance with an embodiment of the present invention.

Referring to FIG. 7 there is illustrated a cross sectional view through 7-7' of the adjustable clamp 600 in a first position when incorporated into an adjustable clamp system 700 for clamping a die assembly during wire bonding in accordance with an embodiment of the present invention. The adjustable clamp system 700 includes the adjustable clamp 600 and two pairs of clamping members 710 (only three clamping members are shown), each one of the clamping members 610 are movable towards a respective base clamping surface 620, as illustrated by arrow B, to thereby clamp the lead frame 120 of a die assembly 100 therebetween. Each of the clamping members 710 form a section of a continuous track that aligned with the continuous track formed by the each base clamping surfaces 620.

As shown, the lead frame 120 has been clamped between the clamping members 610 and the respective base clamping surfaces 620. The lead frame 120 and die assembly 100 in this embodiment are identical to that of FIG. 1, however, other lead frames and die assemblies can be used without departing from the spirit and scope of the invention.

The adjustable clamp system 700 further includes a controller 720 coupled to the Position Sensor, more specifically the controller 720 is coupled to receive sensor signals from the laser beam detector 670 and optionally the controller 720 can be coupled to the laser beam emitter 660. However, the laser beam emitter 660 need not be coupled to the controller 720 and can be a stand-alone device.

There is also a drive 730 that is controllable by the controller 720. The drive can be any form of drive and in this embodiment the drive is servo-motor that includes an arm 740 that moves in the directions illustrated by arrow C. The arm 740 is coupled to and supports the die assembly support 640. In operation, the arm 740 moves in directions illustrated by arrow C and thereby provides movement of the die assembly support 640 relative to each base clamping surface 620 to thereby adjust a depth of the cavity 650. However, it will be apparent to a person skilled in the art that this relative movement could also be provided by the arm 740 coupling to and supporting the base walls 210.

As illustrated, in this first position the depth of the cavity is greater than the maximum "down-set" distance D allowable due to manufacturing tolerances. Consequently, the mount underside 320, of the die mount region 330, is spaced from the die assembly support 230 whilst the arm undersides of the arms 140 and undersides of the pads 180 abut the base clamping surface 620. In other words, the die mount region 130 is suspended in the cavity 240.

The adjustable clamp system 700 also includes a heater 750 for heating the base walls 610 and therefore the heater is aligned and adjacent the base walls 610. However, in another embodiment the heater 750 may be integrated into the base walls 610.

Figure 8:
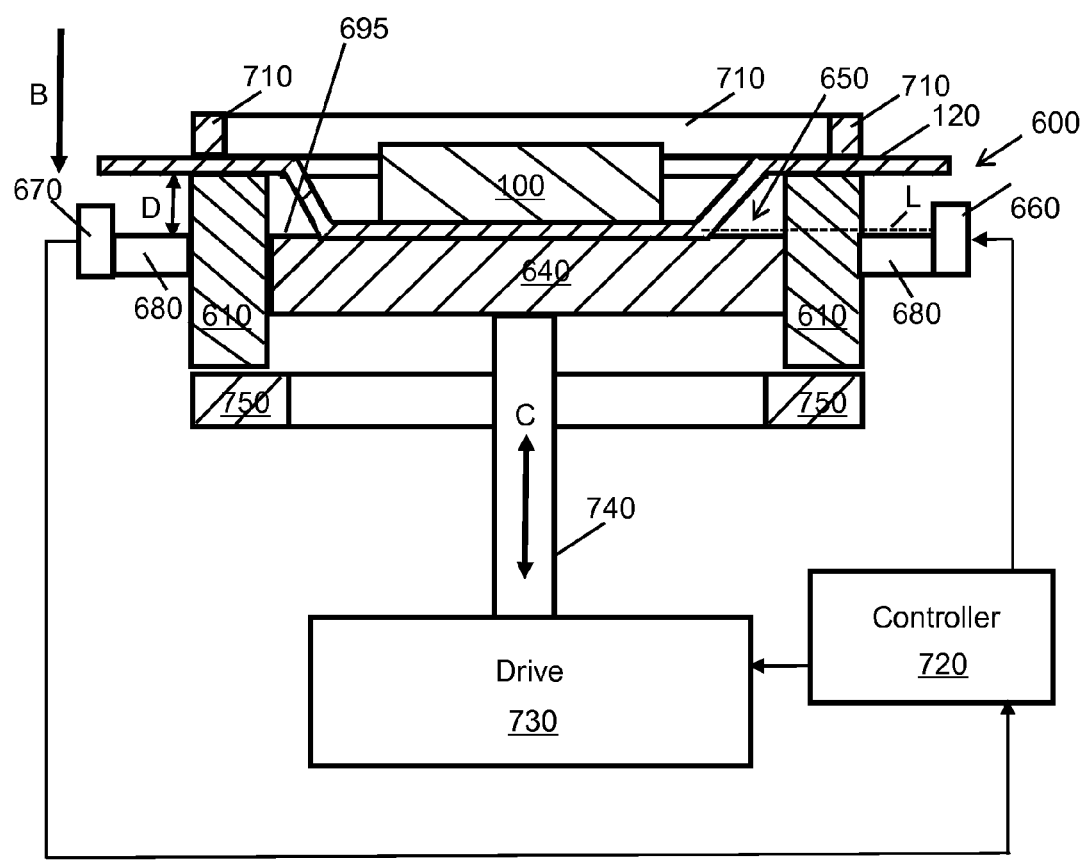
FIG. 8 illustrates a cross-sectional view through 7-7' of the adjustable clamp of FIG. 6 in a second position when incorporated into the adjustable clamp system in accordance with an embodiment of the present invention.

Referring to FIG. 8 there is illustrated a cross sectional view through 7-7' of the adjustable clamp 600 in a second position when incorporated into the adjustable clamp system 700 for clamping a die assembly during wire bonding in accordance with an embodiment of the present invention. This second position occurs after the first position. In other words, the second position occurs after the lead frame 120 has been clamped between the base clamping surface 620 and clamping members 710 so that the die mount region 130 is initially suspended in the cavity 240. To reach the second position the controller 720 allows the drive 730 to provide the relative movement until the position sensor PS detects that an underside of the lead frame 120 has abutted the die assembly support 640. In this embodiment, the Position Sensor PS detects that an underside of the lead frame 120 has abutted the die assembly support 640 when the laser beam L is broken by the lead frame 120, and more specifically an underside of the die mount region 130. It will therefore be apparent to a person skilled in the art that the position sensor PS provides two sensor signals to the controller 720. A first one of sensor signals is indicative of the underside of the lead frame 120 abutting the die assembly support 640 and blocking the laser beam L from reaching the laser beam detector 670. Also, a second one of the sensor signals indicative of the underside of the lead frame 120 being spaced from the die assembly support 640 thereby not blocking with the laser beam L.

Figure 9:
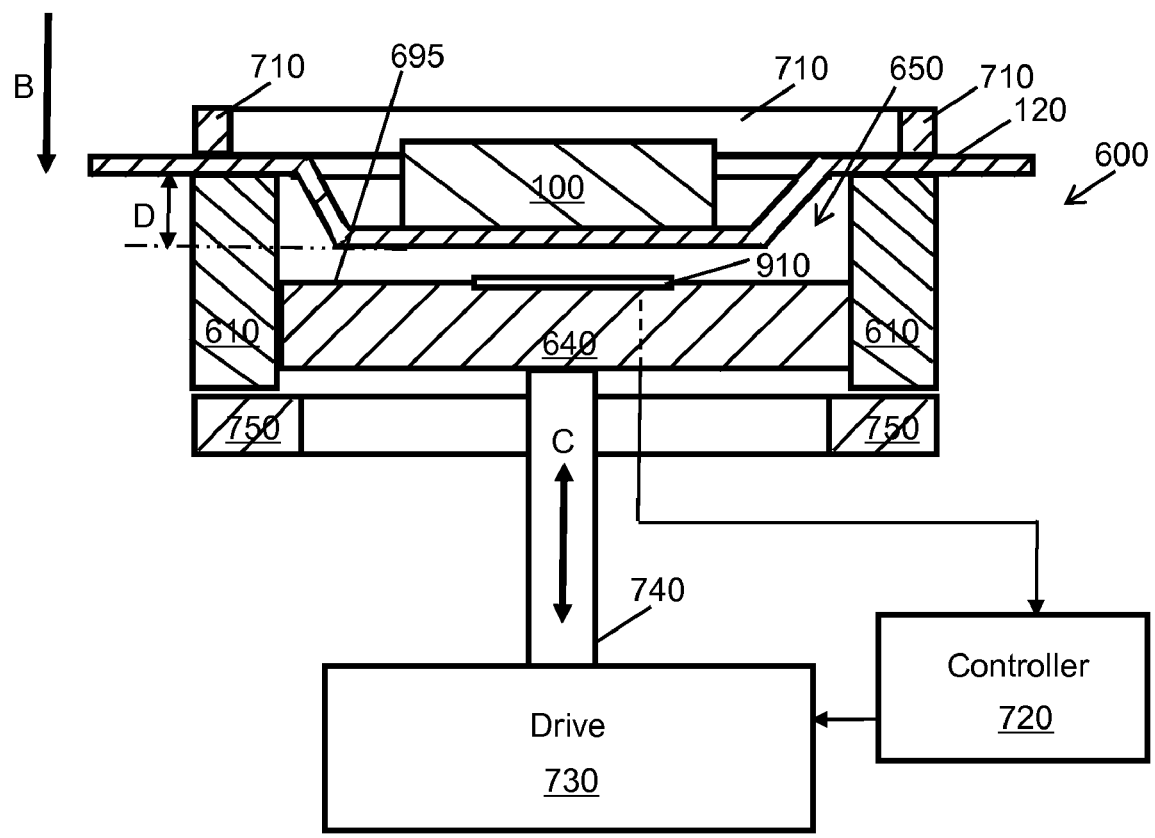
FIG. 9 illustrates a cross-sectional view of an adjustable clamp system in accordance with another embodiment of the present invention.

Referring to FIG. 9 there is illustrated a cross sectional view of an adjustable clamp system 900 for clamping a die assembly during wire bonding in accordance with another embodiment of the present invention. As most of the elements have been described above with reference to FIGS. 7 and 8, a repetitive description of this system is not required for one of skill in the art to understand the invention and only the differences will be described. As illustrated, the Position Sensor PS is this embodiment is a sensor 910 mounted on an upper surface of the die assembly support 640 and coupled to the controller 720. More specifically, in one embodiment the sensor 910 is a pressure sensor on an upper surface of the die assembly support 640. In an alternative embodiment, the sensor 910 includes electrical contacts on an upper surface of the die assembly support 640. In operation, the sensor 910 detects that an underside of the lead frame 120 has abutted the die assembly support 640. The sensor 910 detects this abutting either when pressure is detected by the sensor 910 (if it is a pressure sensor), or when there is a closing of an electrical connection (when the sensor 910 includes electrical contacts).

Figure 10:
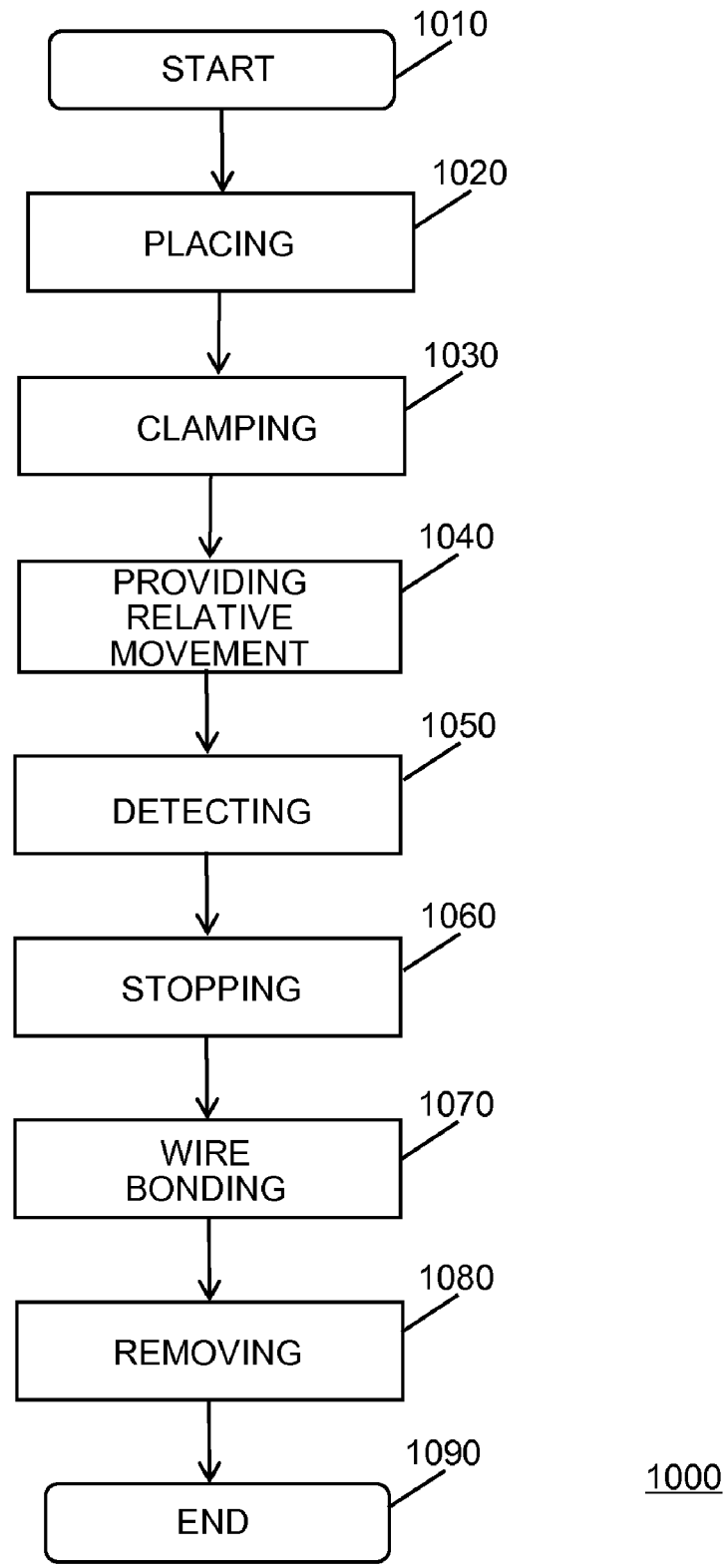
FIG. 10 is illustrated a flow diagram of a method for clamping a die assembly during wire bonding in accordance with an embodiment of the present invention.

Referring to FIG. 10 there is illustrated a flow diagram of a method 1000 for clamping a die assembly during wire bonding. The method 1100 in this embodiment is performed by the adjustable clamp system 700 or by the adjustable clamp system 900. Also, the die assembly 100 can be any suitable die assembly, however, the die assembly 100 will be used for illustration purposes. This die assembly 100 includes the lead frame 120 that has the die mount region 130 with a die 110 attached to the mount region 130.

The method 1000 starts at a start step 1010 and the start step 1010 includes heating the opposing base walls 610. It will be noted that the heating the opposing base walls 610 is a continuous process and continues throughout all steps of the method 1000. Furthermore, at the start step 1010 the adjustable clamp system 700 is in the first position in which the depth of the cavity is greater than the maximum "down-set" distance D of the lead frame 120 that is allowable due to manufacturing tolerances.

After the start step 1010, the method 1100 performs a step of placing 1020 the die assembly 100 in the adjustable clamp system 700 or 900. Next, there is performed a step of clamping 1030 the lead frame 120 between the clamping members 710 and the base clamping surfaces 620 provided by the opposing base walls 610. The method 1000 then performs a step of providing relative movement 1040 of the of the die assembly support 640 relative to the base clamping surfaces 620 to thereby adjust a depth of the cavity 650. A step of detecting 1050 performs detecting that an underside of the lead frame 120 has abutted the die assembly support 640. This step of detecting 1050 is provided by the Position Sensor PS providing the two sensor signals to the controller 720. Thus, the detecting 1050 occurs when the first one of sensor signals indicates that the underside of the lead frame 120 abuts the die assembly support 640 and before the detecting the second one of the sensor signals indicates that the underside of the lead frame 120 is spaced from the die assembly support 640. Next, the method 1000 performs a step of stopping 1060 the relative movement in response to the detecting 1050 and then there is performed a further step of wire bonding 1070 electrodes 190 of the die 110 to respective pads 180 of the lead frame 120. The die assembly 100 is then removed from the adjustable clamp system 700 or 900 at a removing step 1080 and the method 1000 then terminates at an end step 1090.

Advantageously, the present invention alleviates the abovementioned problems caused by skewing or bouncing. More specifically, since the die assembly 100 is first clamped whilst the die mount region 130 is suspended in the cavity 650 there can be little possibility of skewing. Further, because the die assembly support 640 is then moved to abut and support the underside of the lead frame 120 at the die mount region 130 there is little possibility of bounce during wire bonding.

The description of the preferred embodiments of the present invention has been presented for purposes of illustration and description, but is not intended to be exhaustive or to limit the invention to the forms disclosed. It will be appreciated by those skilled in the art that changes could be made to the embodiments described above without departing from the broad inventive concept thereof. It is understood, therefore, that this invention is not limited to the particular embodiment disclosed, but covers modifications within the spirit and scope of the present invention as defined by the appended claims.

The invention claimed is:

1. A method for clamping a die assembly during wire bonding, the die assembly having a lead frame with a die mount region with a die attached thereto, the method comprising:

placing the die assembly in an adjustable clamp system, the system having opposing base walls and a die assembly support disposed between the pair of opposing base walls, wherein the die assembly support and pair of opposing base walls form a cavity over which the die mount region is suspended by leads of the lead frame;

clamping the lead frame between clamping members and base clamping surfaces provided by the opposing base walls;

heating the opposing base walls with a heater that is disposed directly below the opposing base walls, and wherein the heater does not contact the die assembly support and the heater does not contact the lead frame and the heater does not directly heat the die assembly support and the lead frame die mount region;

providing relative movement of the die assembly support relative to the base clamping surfaces to thereby adjust a depth of the cavity;

detecting that an underside of the lead frame has abutted the die assembly support; and stopping the relative movement in response to the detecting.

2. The method of claim 1, further comprising heating the opposing base walls before performing the placing.

3. The method of claim 1, wherein the base clamping surfaces form a section of a continuous track that surrounds the die assembly support.

4. The method of claim 3, wherein the clamping members form a section of the continuous track.

5. The method claim 1, wherein the detecting is performed by a position sensor providing at least two sensor signals, a first one of sensor signals being indicative of the underside of the lead frame abutting the die assembly support and a second one of the sensor signals being indicative of the underside of the lead frame being spaced from the die assembly support.

6. The method of claim 5, wherein the position sensor includes a laser beam emitter aligned with a laser beam detector and wherein the laser beam emitter provides a laser beam along a plane of an upper surface of the die assembly support.

7. The method of claim 1, the method including a further step of wire bonding electrodes of the die to respective pads of the lead frame, the wire bonding being performed after the stopping has been performed.

* * * * *